United States Patent [19]
Iwai

[11] Patent Number: 6,132,160
[45] Date of Patent: *Oct. 17, 2000

[54] SUBSTRATE TRANSFERRING APPARATUS

[75] Inventor: Hiroyuki Iwai, Sagamihara, Japan

[73] Assignee: Tokyo Electron Limited

[ * ] Notice: This patent issued on a continued prosecution application filed under 37 CFR 1.53(d), and is subject to the twenty year patent term provisions of 35 U.S.C. 154(a)(2).

[21] Appl. No.: 09/102,541

[22] Filed: Jun. 23, 1998

[30] Foreign Application Priority Data

Jun. 27, 1997 [JP] Japan ..................................... 9-187492

[51] Int. Cl.$^7$ ..................................................... B65B 21/02
[52] U.S. Cl. .......................... 414/416; 414/222; 414/937
[58] Field of Search ..................................... 414/416, 937, 414/941, 217, 222, 225; 118/719

[56] References Cited

U.S. PATENT DOCUMENTS

| | | | |
|---|---|---|---|
| 5,442,416 | 8/1995 | Tateyama et al. | 414/416 X |
| 5,460,478 | 10/1995 | Akimoto et al. | 414/416 X |
| 5,655,871 | 8/1997 | Ishii et al. | 414/416 |
| 5,700,127 | 12/1997 | Harada et al. | 414/416 |
| 5,826,129 | 10/1998 | Hasebe et al. | 414/416 X |

FOREIGN PATENT DOCUMENTS

| | | |
|---|---|---|
| 6-127621 | 5/1994 | Japan . |
| 7-106402 | 4/1995 | Japan . |

*Primary Examiner*—Dean J. Kramer
*Assistant Examiner*—Steven B. McAllister
*Attorney, Agent, or Firm*—Smith, Gambrell & Russell, LLP

[57] ABSTRACT

A substrate transferring apparatus 8 for taking out a semiconductor substrate W to be processed housed in a container 6 from within the container 6 comprises support plates 9 and a positional error correcting member 23 on each support plate. Each support plate 9 has a base portion and is to be inserted into the container 6 to take out the substrate W. The positional error correcting member 23 is provided at the base portion of the support plate 9. The member 23 is to abut a part of the substrate W projecting out of the container 6 and to push back the substrate W into the container 6 when the support plate 9 is inserted into the container 6.

14 Claims, 6 Drawing Sheets

SUBSTRATE TRANSFERRING APPARATUS

FIELD OF THE INVENTION

This invention relates to a substrate transferring apparatus for transferring substrates such as semiconductor wafers.

BACKGROUND OF THE INVENTION

In processing systems for substrates to be processed such as semiconductor wafers, a substrate transferring apparatus is used for automatic transference or transportation of the semiconductor wafers, between a carrier or a cassette which is a conveying container in which a plurality of semiconductor wafers are supported and a processing section, or between a carrier and a wafer boat which is a processing container. An example of those processing systems using the transferring apparatus is a heat-processing system.

The heat-processing system is used for oxidation, diffusion annealing, film formation or the like of the semiconductor wafers. For example, in the batch-processing type of the heat-processing system, an operation moving semiconductor wafers into the wafer boat from the carrier and loading the wafer boat into the heat-processing furnace and an operation placing back the wafers into the carrier from the unloaded wafer boat are carried out. Thus the loading chamber of the heat-processing system is provided with a substrate transferring apparatus for transferring semiconductor wafers between the carrier and the wafer boat.

FIG. 11 shows a conventional substrate transferring apparatus. The apparatus 80 has a plurality of support plates 9 provided in multi-stairs for supporting and transferring semiconductor wafers W. The plurality of support plates 9 are so provided that they can be raised or lowered, rotated horizontally, and moved forward and backward. Those support plates 9 are inserted into the carrier 6, pick up the semiconductor wafers W on themselves and transfer the semiconductor wafers W from within the carrier 6 into the wafer boat 4 or vice versa.

However, if a semiconductor wafer Wx is projecting out of the cassette or the wafer boat 4 with a positional error such as shown in FIG. 11, the above conventional substrate transferring apparatus can not correct the positional error. In this case, the semiconductor wafer Wx can not be correctly placed on the substrate plate, and the semiconductor wafer Wx may fall out on the way of transferring. An apparatus, which detects a substrate projecting out of a container such as a cassette and gives an alarm has been proposed. However, the above problem is essentially not solved by such proposal.

SUMMARY OF THE INVENTION

Therefore, the object of this invention is to provide a substrate transferring apparatus which can automatically correct a positional error by a substrate projecting out of the container being pushed back when a support plate is inserted into the container, and which can prevent the falling out of the substrate on the way of transferring.

To achieve the above object, this invention is characterized by a feature that a substrate transferring apparatus, which has support plates and operates to position the support plates into a container enclosing substrates in multi-stairs to put the substrates on the support plates, respectively, for transferring, comprises a positional error correcting member which is provided at a base portion of each of the support plates for abutting a peripheral edge of each of the substrates projecting out of the container and for pushing back each substrate into the container when the support plates are inserted into the container.

In this invention, the positional error correcting member is preferably integrally formed with the base portion of the support plate, and the positional error correcting member has an abutment surface in a shape corresponding to that of a peripheral edge of the substrate. Further, preferably, the apparatus comprises a plurality of support plates in multi-stairs corresponding to the substrates in the container and the positional error correcting member is provided between each two neighboring base portions of the plurality of support plates and at an upper portion of the base portion of the highest plate of the plurality of support plates.

That is, one feature of this invention is that a substrate transferring apparatus for taking out a substrate to be processed placed in a container from the container, comprises a support plate, having a base portion, for being inserted into the container to take out the substrate, a positional error correcting member, provided at the base portion of the support plate, for abutting a part of the substrate projecting out of the container and pushing back the substrate into the container when the support plate is inserted into the container.

The positional error correcting member may be integrally formed with the base portion of the support plate.

The positional error correcting member may have an abutment surface of a shape corresponding to that of a peripheral edge of the substrate. For example, the substrate may have a circular shape and an abutment surface of the positional error correcting member may have a recessed shape corresponding to the circular shape of the substrate.

The apparatus may comprise a plurality of support plates for taking out a plurality of substrates in the container in multi-stairs or tier-like fashion from the container, each of the plurality of support plates may correspond to one of the plurality of substrates in the container, and the positional error correcting member may be provided at an upper portion or side portions of the base portion of each of the plurality of support plates.

The support plates may be so provided such that a gap between adjoining support plates is variable.

The apparatus may comprise two support plate holders to hold the support plate wherein one of support plate holders may hold the support plates corresponds to the plural substrates placed in the container in multi-stairs or tier-like fashion, the other of support plate holders may hold only one support plate, and each of support plate holders may have an independent driver.

According to this invention, because the apparatus comprises a positional error correcting member, provided at the base portion of the support plate, for abutting a part of the substrate projecting out of the container and pushing back the substrate into the container when the support plate is inserted into the container, the apparatus can automatically correct a positional error of the substrate by the positional error correcting member abutting a part of the substrate projecting out of the container and pushing back the substrate into the container when the support plate is inserted into the container. Thus, the apparatus can correctly place the substrate on the support plate by correcting a positional error of the substrate if the positional error come into existence by the substrate projecting out of the container owing to vibrations and the like so that the apparatus can prevent the substrate from falling out on the way of transferring.

BEST MODE FOR CARRYING OUT THE INVENTION

The invention will now be described in more detail with reference to the accompanying drawings.

Figure 3:
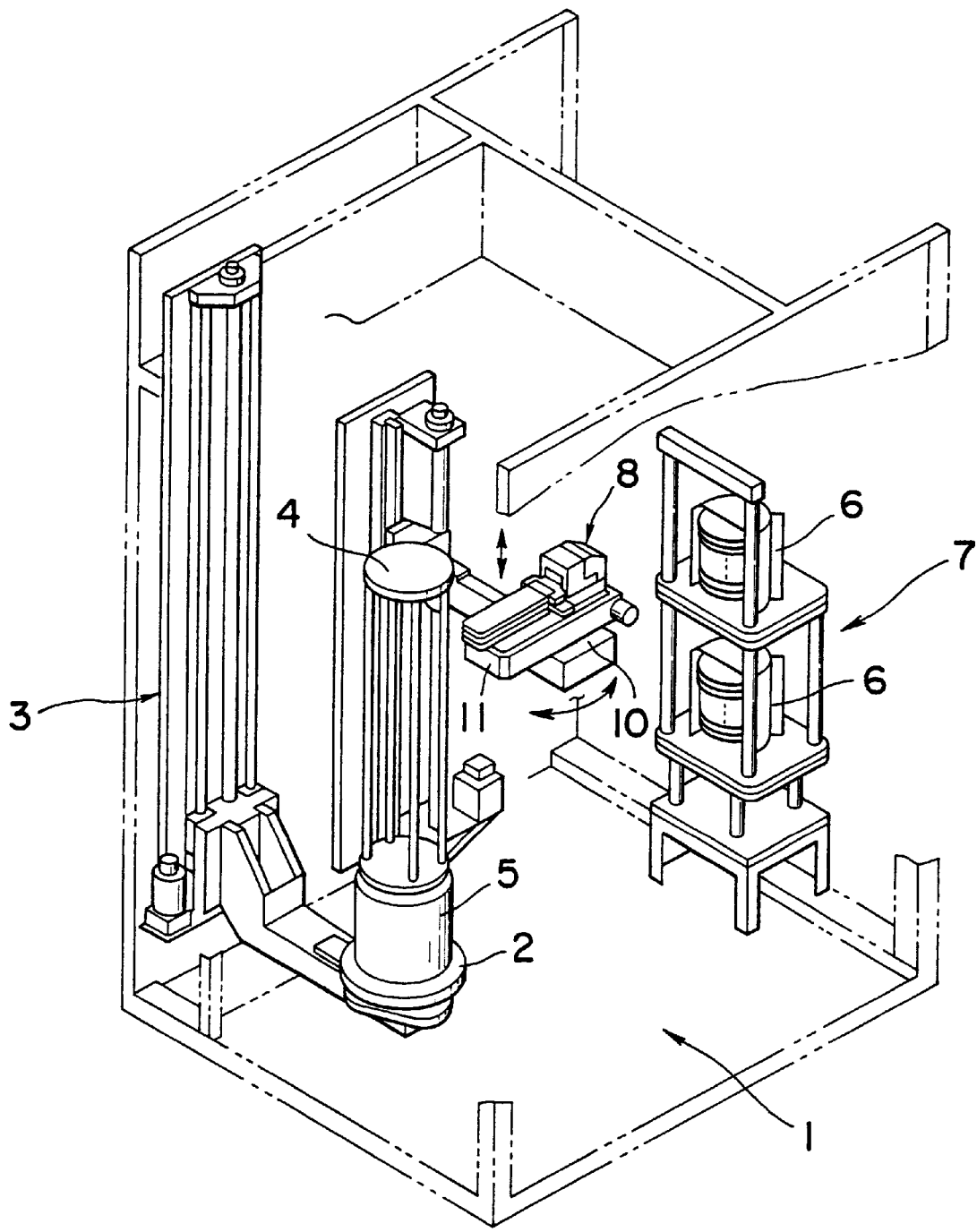
FIG. 3 is a perspective view showing a part of a heat-processing system which is an example of systems using the apparatus of the invention.

Referring to FIG. 3 which is a perspective view showing a part of the heat-processing system that is an example of the system using the substrate transferring apparatus according to the invention, the reference number 1 indicates a loading chamber. Above the loading chamber 1 is provided a vertical heat-processing furnace (not shown) of batch-processing type, which has a furnace opening at a lower end thereof. Under the vertical heat-processing furnace, a cap body 2 for opening and closing the furnace opening is provided in such a manner that the cap body 2 can be elevated and lowered by an elevating mechanism 3. On the cap body 2 is mounted an upright wafer boat 4 made from quartz with a thermal insulating cylinder 5 interposed therebetween. The wafer boat 4 serves as a processing container supporting therein many semiconductor wafers W (whose number is for example about 150) in multi-stairs or tier-like fashion. The wafer boat 4 is so arranged that it can be loaded into the vertical heat-processing furnace through raising of the cap body 2 by the elevating mechanism 3 and can be unloaded from the furnace into the loading chamber 1 through lowering of the cap body 2.

At a side of the loading chamber 1, there is provided a transferring container enclosing semiconductor wafers (whose number is for example about 25) in multi-stairs or tier-like fashion. For example, the container is a shelf-like carrier stand 7 for supporting thereon wafer carriers 6 made from a plastic. In the loading chamber 1, a wafer or substrate transferring apparatus 8 is provided for transferring semiconductor wafers W between an unloaded wafer boat 4 and a carrier 6 on the carrier stand 7.

Figure 1:
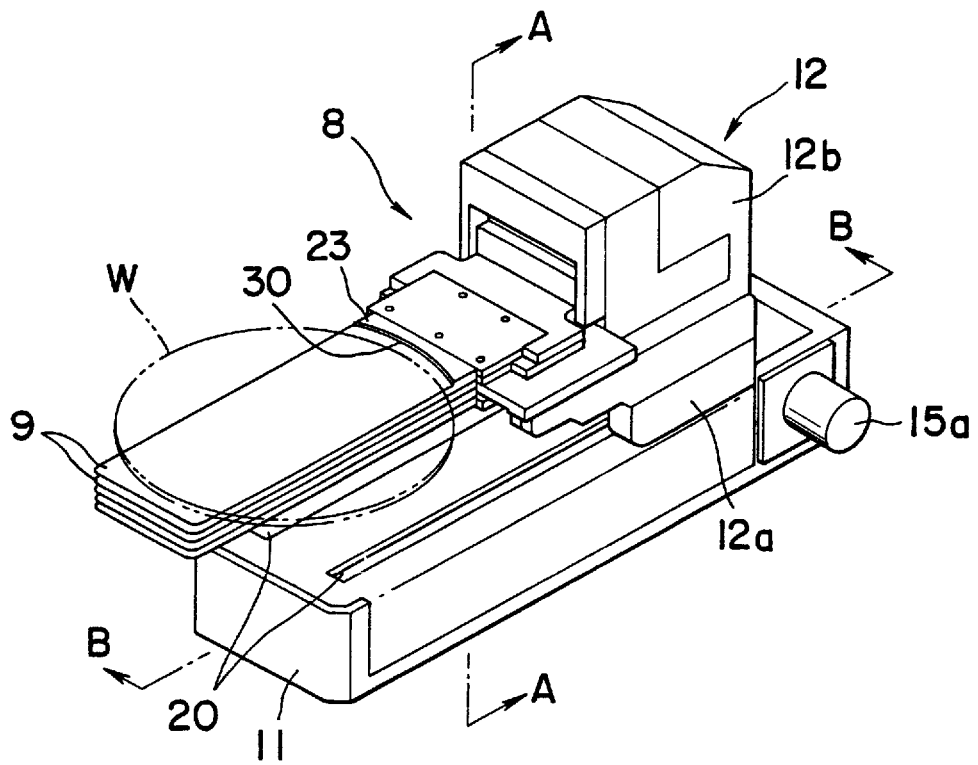
FIG. 1 is a perspective view showing an embodiment of the substrate transferring apparatus according to the invention.

As most clearly shown in FIG. 1, the apparatus 8 has an elongated thin-plate-like support plates 9 or fork for supporting and transferring semiconductor wafers W. The support plates 9 are provided so as to be capable of being elevated and lowered, being rotated horizontally and being moved forward and backward. Each support plate 9 is made of an aluminum ceramics or the like and formed into an elongated thin-plate-like shape. Each support plate 9 is inserted horizontally into the carrier 6 or the wafer boat 4, picks up thereon a semiconductor wafer W in the carrier 6 or the wafer boat 4, and takes out the wafer W from within the carrier 6 or the wafer boat 4.

Figure 4:
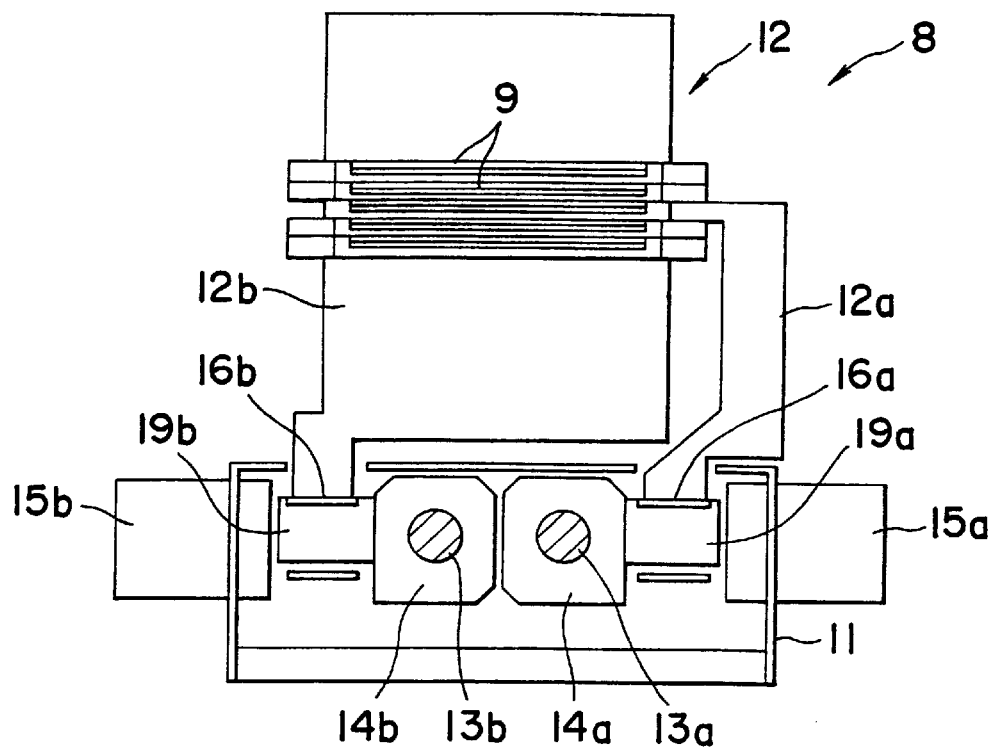
FIG. 4 is a cross sectional view taken along an A—A line of FIG. 1.

In more detail, the substrate transferring apparatus 8 comprises an elevator arm 10 (FIG. 3) which is raised and lowered by a elevator driver not shown, a box-like base stand 11 which can rotate horizontally on the elevator arm 10, a transfer carriage (support plate holder) 12 which can be moved forward and backward on the base stand 11, and the support plates 9 which are attached to the transfer carriage 12. In this substrate transferring apparatus 8, as seen in FIGS. 1 and 4, the transfer carriage 12 is divided into a first transfer member 12a for transferring wafers one by one and a second transfer member 12b for transferring wafers in a lump group. Thus, the substrate transferring apparatus 8 can transfer a wafer or wafers both one by one and in a lump group.

In order to move these transfer members 12a and 12b independently forward or backward, a pair of right and left guide rods 13a and 13b formed, for example, by spline shafts, are arranged in parallel in the base stand 11 along the longitudinal direction of the base stand 11, and sliding members 14a and 14b are slidably fitted on the guide rods 13a and 13b, respectively. At the outer sides of the guide rod 13a and 13b, timing belts 16a and 16b driven by stepping motors 15a and 15b, respectively, are arranged in parallel.

Figure 5:
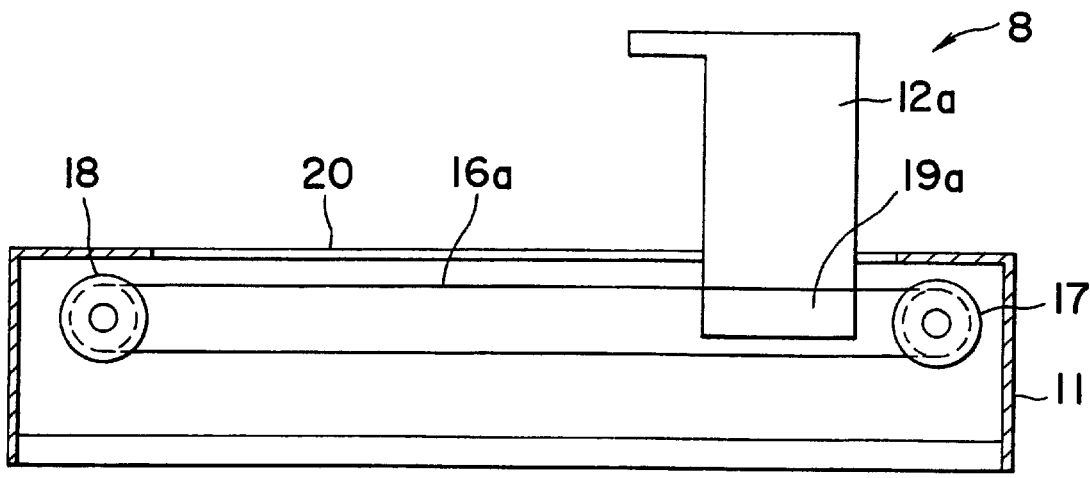
FIG. 5 is a sectional view taken along a B—B line of FIG. 1.

For example, on the side of the first transfer member 12a, as seen in FIG. 5, a drive pulley 17 driven by the stepping motor 15a and a driven pulley 18 are arranged in one longitudinal end and the other end of the base stand 11, respectively. Around these drive pulley 17 and driven pulley 18 are passed the timing belt 16a. For the second transfer member 12b the same mechanism as above is used. The first transfer member 12a is attached through the one timing belt 16a to a block 19a projecting from the side of the one sliding member 14a, while the second transfer member 12b is attached through the other timing belt 16b to a block 19b projecting from the side of the other sliding member 14b.

On the upper surface of the base stand 11, slits 20 are provided for allowing the transfer members 12a and 12b to move therethrough. To the first transfer member 12a, a single support plate 9 is attached, while to the second transfer member 12b, a plurality (for example, four or five) for support plates 9 are attached in multi-stairs. In the case of the illustrated embodiment, the support plate 9 of the first transfer member 12a is placed at an intermediate position of the support plates 9 of the second transfer member 12b. The support plate 9 on the first transfer member 12a may be placed over the support plates 9 on the second transfer member 12b or below those as shown in FIG. 7.

The support plates 9 of the second transfer member 12b are arranged at a pitch corresponding to an arrangement pitch of grooves (not shown) in the carrier 6, which grooves help semiconductor wafer W to be accommodated with fixed gaps in the carrier 6. However, in order to cope with a case in which the arrangement pitch of the grooves in the carrier 6 is different from the arrangement pitch of the grooves in the wafer boat 4, the support plates 9 of the second transfer member 12b may be arranged in such a manner as to be variable in pitch by means of a pitch varying mechanism such as a screw feed mechanism which can change gaps between the support plates 9 relatively.

Figure 6:
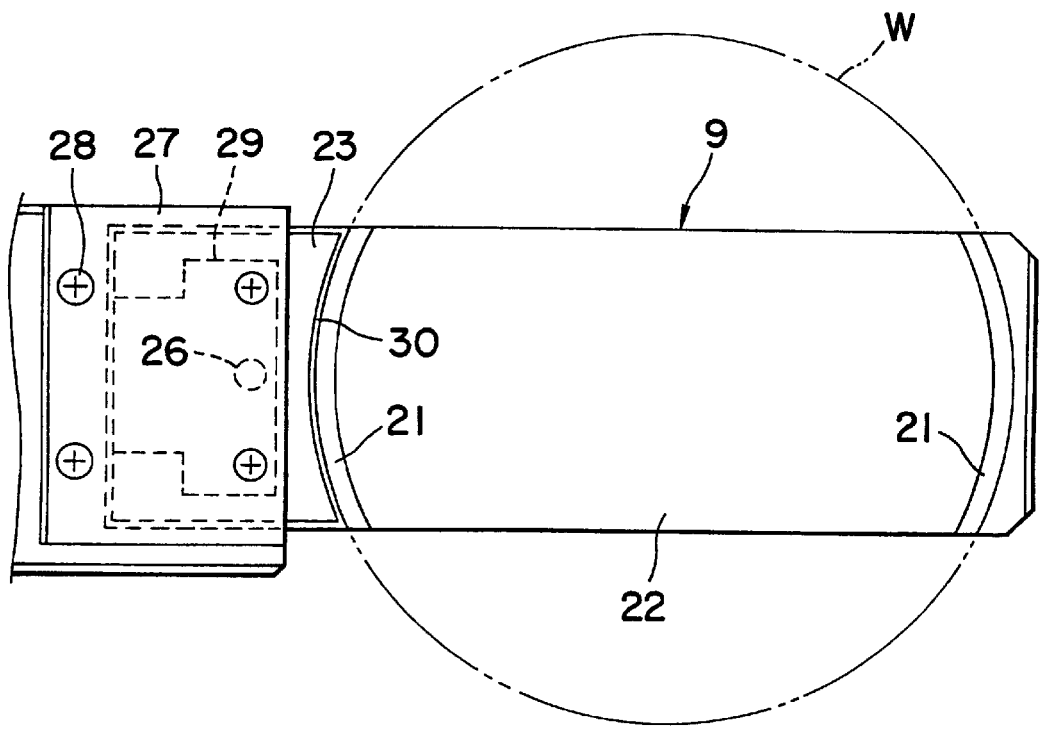
FIG. 6 is a plane view showing a main part of the substrate transferring apparatus.
Figure 7:
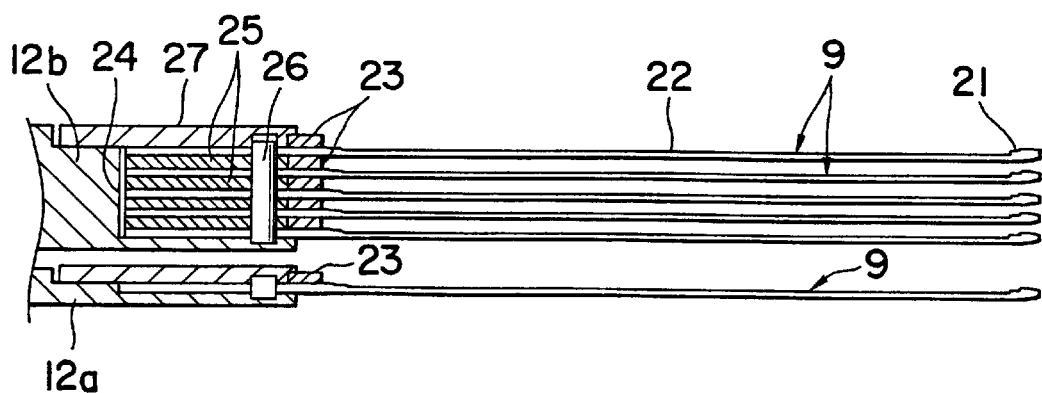
FIG. 7 is a longitudinal sectional view of FIG. 6.

On the upper surface of each support plate 9, as shown in FIGS. 6 and 7, a stepped support part 21 having an abutment shoulder corresponding to the peripheral edge of the circular semiconductor wafer W is formed. The semiconductor wafer W is held, positioned and carried with stability by the abutment shoulder of the support part 21. In order to prevent dust from adhering to the back side of the semiconductor wafer W, a recessed surface portion 22 having a slightly smaller radius than that of the semiconductor wafer W may be formed inside of the support part 21, so that only the periphery of the semiconductor wafer W is supported by the support part 21, and the back side of the semiconductor wafer W except for its periphery does not contact with the support plate 9.

At the base portion of each support plate 9, a positional error correcting member 23 is provided for correcting a positional error of the semiconductor wafer W. The positional error is corrected through abutment of the correcting member 23 with the peripheral edge of the semiconductor W which is projecting out of the carrier 6 or the wafer boat 4 owing to vibrations and the like, and through pushing back of the semiconductor wafer W by the correcting member 23 into the carrier 6 or the wafer boat 4 when the wafer W is inserted into the carrier 6 or the wafer boat 4.

In the second transfer member 12b, as shown in FIG. 7, a recessed portion 24 is formed for accommodating the base edges of the plural support plates 9. In the recessed portion 24, the base edges of the support plates 9 are layered at a fixed pitch with a spacer 25 inserted between each two neighboring plates 9. In the recessed portion 24 of the second transfer member 12b, a positioning pin 26 is passed and attached through the spacers 25 and the support plates 9. Over the recessed portion 24, a holding plate 27 is attached by screws 28. Thus, the support plates 9 are attached fixedly in the second transfer member 12b in a cantilever fashion.

The rear portion of the holding plate 27 and the spacers 25 are made of aluminum and formed as an engagement portion 29 whose shape is substantially a Tshape in plan view. The positional error correcting member 23 is made of a fluorine-containing resin or the like and formed into substantially a C-shape in plan view so that it can fit on the engagement portion 29. Thus, the positional error correcting members 23 are arranged between two neighboring base portions of the layered support plates 9 and on the upper surface of the base portion of the highest plate 9. In order to prevent a partial stress from occurring in the semiconductor wafers W when the semiconductor wafers W are pushed back, an arcuate abutment surface 30 corresponding to the peripheral shape of the semiconductor wafer W is preferably formed on the positional error correcting member 23 so that the member 23 can be brought in face-to-face abutment with the periphery of the semiconductor wafer W. The first transfer member 12a has a similar configuration to that of the second transfer member 12b except for a single support plate 9 being provided and the member 12a having no spacer 25.

Figure 2A:
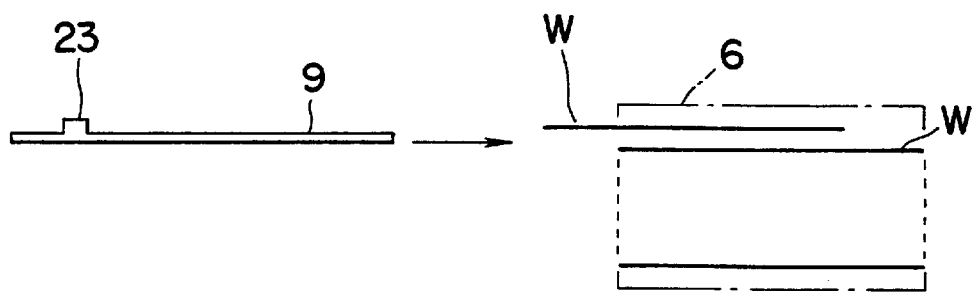
FIGS. 2a and 2b are explanatory diagrams showing a function of correcting a positional error of the substrate in the apparatus of FIG. 1.
Figure 2B:
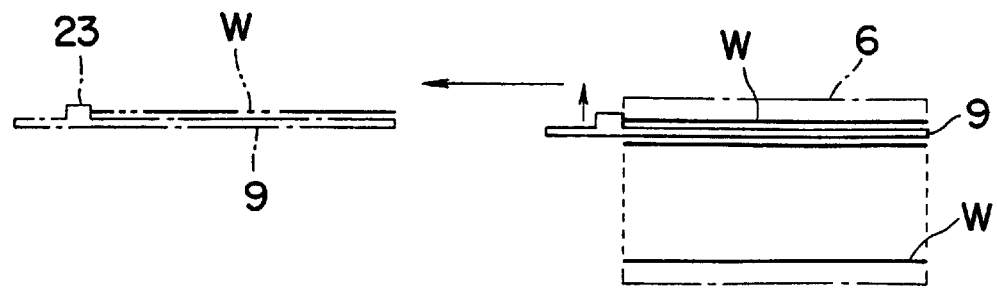

According to the substrate transferring apparatus 8 having the above configuration, similarly to the conventional substrate transferring apparatus, the transfer operation for the semiconductor wafer W can be performed between the unloaded wafer boat 4 and the carrier 6 on the carrier stand 7 in the loading chamber 1. Particularly, in the case where a semiconductor wafer W is projecting out of the carrier 6 owing to vibrations and the like as seen in FIG. 2a, when the support plate 9 is advanced horizontally and inserted into the carrier 6 to pick up a semiconductor wafer W, the abutment surface 30 of the positional error correcting member 23 provided at the base portion of the support plate 9 can push back the semiconductor wafer W into the carrier 6 and correct any positional error of the semiconductor wafer W as shown in FIG. 2b.

When the support plate 9 is inserted into the carrier 6 and scoops up a semiconductor wafer W, the wafer W is guided by the abutment surface 30 of the positional error correcting member 23, put on the support plate 9, held in the recessed support part 21 and supported stably. Then the support plate 9 is moved backward so that the semiconductor wafer W can be transfered from within the carrier 6 while keeping a stable supporting condition. Thus there is no fear of semiconductor wafers W falling out on the way of transferring. In the case where a semiconductor wafer W projects out of the wafer boat 4, the semiconductor wafer W can also be pushed back into the wafer boat 4 so that positional error of the semiconductor wafer W is corrected.

As above described, according to the substrate transferring apparatus 8, because the positional error correcting member 23 is provided at the base portion of each support plate 9 for abutting the peripheral edge of a semiconductor wafer W projecting out of the carrier 6 or the wafer boat 4 and for pushing back the wafer W into the carrier 6 or wafer boat 4 when the support plate 9 is inserted into the carrier 6 or the wafer boat 4, the apparatus 8 can automatically correct a positional error of the semiconductor wafer W through pushing back the projecting semiconductor wafer W into the carrier 6 or the safer boat 4, by only the inserting operation of the support plate 9. Thus if a semiconductor wafer W projects out of the carrier 6 or the wafer boat 4 owing to vibrations and the like, the apparatus can always correctly place the semiconductor wafer W on the support plate 9 by automatically correcting the positional error, so that the apparatus can prevent the semiconductor wafer W from falling out on the way of transferring.

Figure 8:
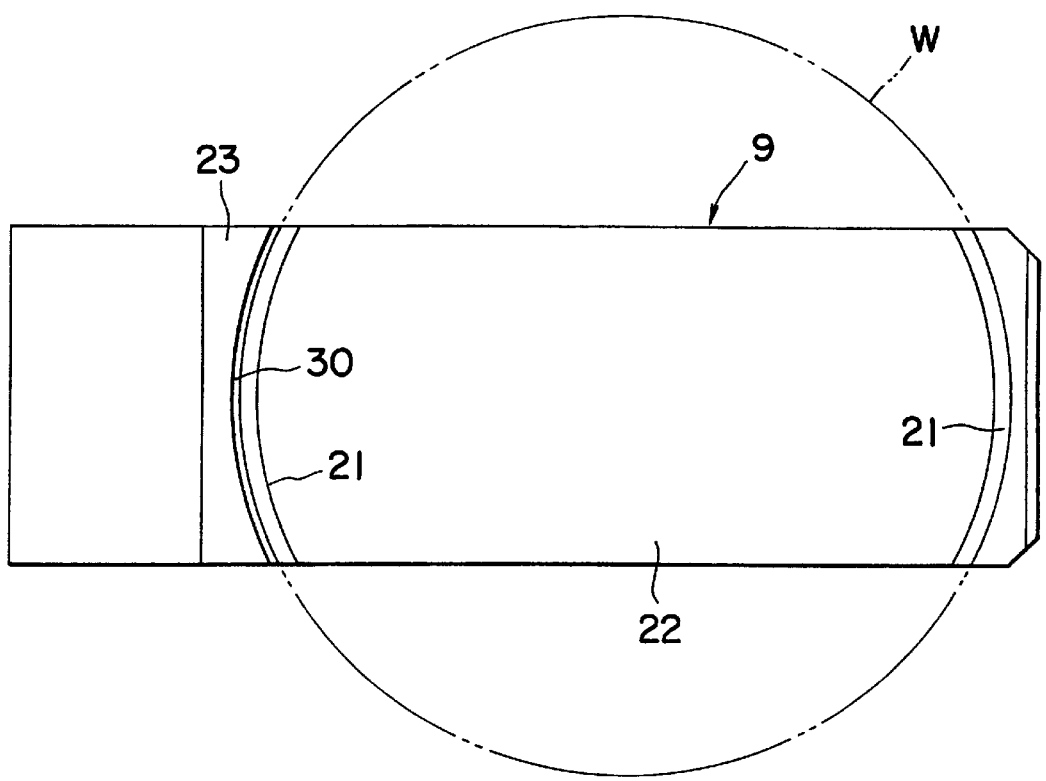
FIG. 8 is a plane view of the support plate of another embodiment of the substrate transferring apparatus according to the invention.
Figure 9:
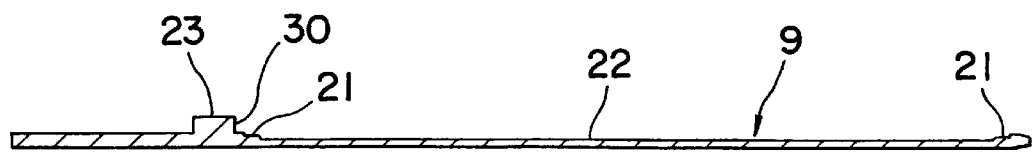
FIG. 9 is a longitudinal sectional view of the support plate of FIG. 8.

FIG. 8 and FIG. 9 show a support plate 9 in another embodiment of the substrate transferring apparatus according to the invention. On the support plate 9, similarly to that of the first embodiment, a support part 21 for supporting the semiconductor wafer W and a recessed surface portion 22 are formed. On the upper surface of the base portion of each of the support plates 9, the positional error correcting member 23 is integrally formed for abutting the peripheral edge of the semiconductor wafer W projecting out of the carrier 6 or the wafer boat 4 and pushing back the wafer W into the carrier 6 or wafer boat 4 when the support plate 9 is inserted into the carrier 6 or the wafer boat 4.

The above positional error correcting member 23 is formed into a protruding shape adapted to abut the semiconductor wafer W continuously widthwise of the base portion of the support plate, in a different manner from that in FIG. 6. On the front edge surface of the positional error correcting member 23, a arcuate abutment surface 30 corresponding to the peripheral edge of the semiconductor wafer W is formed. According to the substrate transferring apparatus using the support plate 9, it has not only a similar effect to the above first embodiment but also advantages of a simpler construction and of a reduced number of element members. The support plates 9 can be applied to any existing substrate transferring apparatus without adding any other element or reconstructing.

Figure 10:
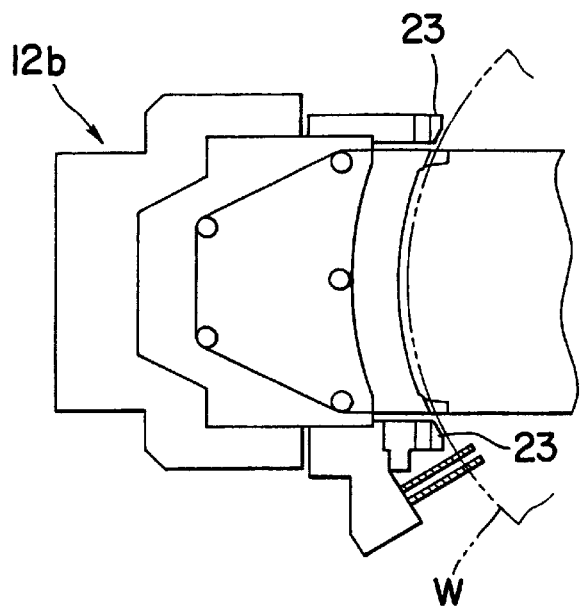
FIG. 10 is a plane view showing a main part of another embodiment of the substrate transferring apparatus.
Figure 11:
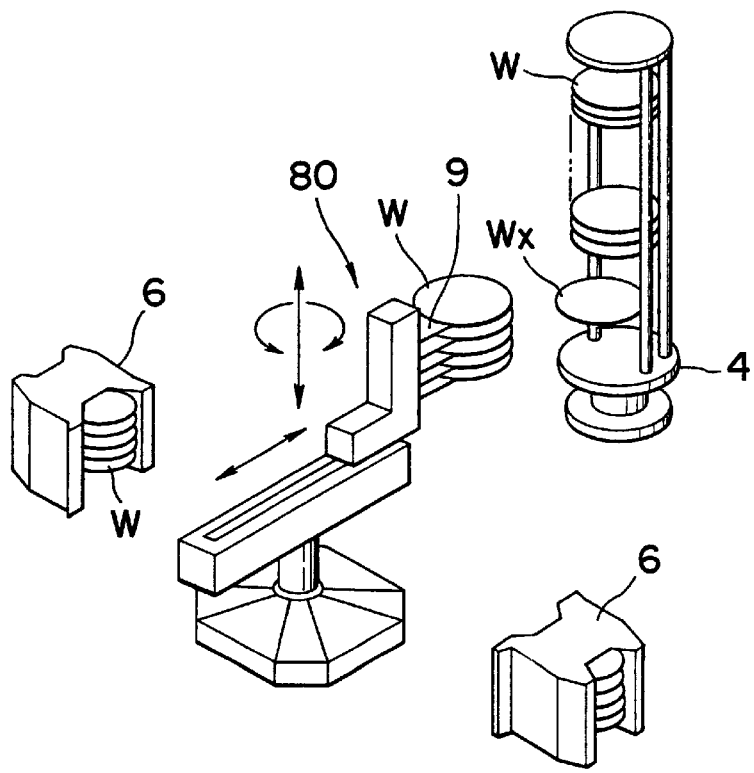
FIG. 11 is a perspective view showing generally a conventional substrate transferring apparatus.

FIG. 10 shows a principal part of the substrate transferring apparatus of a further embodiment according to the invention. The transfer part 12 of the substrate transferring apparatus is formed as a variable pitch structure in which the pitch of the support plates 9 can be changed continuously. Then if the positional error correcting member 23 is arranged between two neighboring base portions of the support plates 9, the least pitch is limited narrowly. Therefore the positional error correcting member 23 is arranged at both side portion of the base portion of each of the support plates 9. According to this substrate transferring apparatus, said positional error correcting member can automatically correct positional error of the semiconductor wafer W without limiting the least pitch between support plates 9.

Since certain changes may be made in the above apparatus without departing from the scope of the invention herein involved, it is intended that all matter contained in the above description, as shown in the accompanying drawing, shall be interpreted in an illustrative, and not a limiting sense. For example, a substrate transferring apparatus having a variable pitch structure may comprise positional error correcting members arranged in a combshape corresponding to each space between each two neighboring base portions of the support plates, so that each positional error correcting member can correspond to each semiconductor wafer W when the pitch between the support plates 9 is varied.

In the above embodiments, each substrate transferring apparatus comprises two transfer members, the first transfer member holding the support plates corresponds to plural substrates housed in the container in multi-stairs or tier-like fashion, the second transfer member holding only one support plate, and each of transfer members having an independent driver. The drivers are switched alternately based on which way of transferring wafers is selected one by one or in a group, however they may be controlled by any other way.

For example, in the case of transferring five semiconductor wafers W in a group, by using four support plates 9 attached at the second transfer member 12b and one support plate 9 attached at the first transfer member 12a, the both drivers are operated at a time to move both the transfer members 12a and 12b simultaneously, so that the five semiconductor wafers W are transfered in a group. In the case of transferring only one semiconductor wafer W, only one driver corresponding to the first transfer member 12a is operated to move the member 12a, so that the one semiconductor wafer W is transfered. In those cases, as seen in FIG. 7, the gap between the lowest support plate 9 attached to the second transfer member 12b and the support plate 9 attached to the first transfer member 12a is the same as the gap between each two neighboring support plates 9 of the second transfer member 12b. Of course, this invention can apply to a substrate transferring apparatus for transferring substrate to be processed one by one. Further, this invention can apply to some steps of not only heat-processing system but also semiconductor-manufacturing system or liquid-crystal-manufacturing system.

In short, according to the substrate transferring apparatus of this invention, because the positional error correcting member is provided at the base portion of the support plate, for abutting the peripheral edge of the substrate projecting out of the container and for pushing back the substrate into the container when the support plate is inserted into the container, the apparatus can automatically correct a positional error of the substrate by the member pushing back the peripheral edge of the substrate projecting out of the container into the container when the support plate is inserted into the container. Thus, the apparatus can correctly place the substrate on the support plate by correcting a positional error of the substrate if the positional error come into existence by the substrate projecting out of the container owing to vibrations and the like, so that the apparatus can prevent the substrate from falling out on the way of transferring.

What is claimed is:

1. A substrate transferring apparatus for taking out a substrate housed in a container from within the container, comprising:

a support plate for being inserted into the container to take out the substrate, said support plate having a base portion and a stepped support part, said stepped support part having an abutment shoulder corresponding to a peripheral edge of the substrate, and a positional error correcting member extending above and located only adjacent each side of the base portion of the support plate, for abutting a part of the substrate projecting out of the container and pushing back the substrate into the container when the support plate is inserted into the container.

2. A substrate transferring apparatus according to claim 1, wherein:

the positional error correcting member is integrally formed with the base portion of the support plate.

3. A substrate transferring apparatus according to claim 1, wherein:

the positional error correcting member has an abutment surface of a shape corresponding to that of a peripheral edge of the substrate.

4. A substrate transferring apparatus according to claim 3, wherein:

the abutment surface of the positional error correcting member has a concave shape which is designed to correspond with a circular shaped substrate.

5. A substrate transferring apparatus according to claim 1, wherein:

the apparatus comprises a plurality of support plates for taking out a plurality of substrates housed in the container in tier-like fashion from the container, each of the plurality of support plates corresponds to one of the plurality of substrates in the container, and the positional error correcting member is located only adjacent each side of the base portion of each of the plurality of support plates.

6. A substrate transferring apparatus according to claim 5, wherein:

the support plates are so provided that a gap between the support plates is variable.

7. A substrate transferring apparatus according to claim 1, further comprising:

two support plate holders to hold the support plate, one of the support plate holders holding the support plates corresponds to a plurality of substrates housed in the container in tier-like fashion, the other of the support plate holders holding only one support plate, and each of support plate holders having an independent driver.

8. A substrate transferring apparatus according to claim 1, wherein:

the stepped support part consists of two support portions opposite to each other.

9. A substrate transferring apparatus according to claim 8, wherein:

a recessed surface portion is formed between the support portions.

10. A substrate transferring apparatus according to claim 5, wherein:

the positional error correcting member is provided at each side of the base portion of each of the plurality of support plates to accommodate for gap variations.

11. A substrate transferring apparatus according to claim 1, wherein:

said stepped support part features an internal wall extending upward from a recess section of said support plate to an intermediate platform section for supporting the substrate to said abutment shoulder.

12. A substrate transferring apparatus according to claim 11 wherein said positional error correcting member is positioned above said abutment shoulder and spaced from said abutment shoulder.

13. A substrate transferring apparatus according to claim 5 wherein said base portion of each of said plurality of support plates is held in cantilever fashion in a recessed portion of a transfer member, wherein a holding plate is compressed against an uppermost positioned positional error correcting member, and spacers are provided between neighboring support plates such that a gap between the support plates is fixed.

14. A substrate transferring apparatus according to claim 6 wherein said positional error correcting member is comprised of side sections positioned to opposite sides of said base member and arranged to accommodate a least pitch spacing position wherein the gap between the support plates is minimized.

* * * * *